United States Patent

Ozeki et al.

[11] Patent Number: 6,138,059
[45] Date of Patent: Oct. 24, 2000

[54] VEHICLE CONTROL SYSTEM AND UNIT FOR PREVENTING POWER SUPPLY CUTOFF DURING RE-PROGRAMMING MODE

[75] Inventors: Yoshifumi Ozeki, Anjo; Eiji Mori, Nagoya; Toshio Tsuji, Inazawa, all of Japan

[73] Assignee: Denso Corporation, Kariya, Japan

[21] Appl. No.: 09/257,240

[22] Filed: Feb. 25, 1999

[30] Foreign Application Priority Data

Mar. 10, 1998 [JP] Japan ................................. 10-058563

[51] Int. Cl.[7] ........................................................ G06F 1/00
[52] U.S. Cl. .................................. 701/1; 701/32; 701/115
[58] Field of Search ................................. 701/1, 32, 33, 701/114, 115

[56] References Cited

U.S. PATENT DOCUMENTS

| | | | |
|---|---|---|---|
| 4,751,633 | 6/1988 | Henn et al. | 714/18 |
| 5,278,759 | 1/1994 | Berra et al. | 701/1 |
| 5,473,540 | 12/1995 | Schmitz | 701/1 |
| 5,521,588 | 5/1996 | Kuhner et al. | 340/825.22 |
| 5,712,969 | 1/1998 | Zimmermann et al. | 714/5 |
| 5,802,485 | 9/1998 | Koelle et al. | 701/29 |
| 5,826,205 | 10/1998 | Koelle et al. | 701/29 |
| 5,826,211 | 10/1998 | Kobayashi | 701/115 |
| 5,857,158 | 1/1999 | Zimmermann et al. | 701/33 |
| 6,009,372 | 12/1999 | Baker et al. | 701/115 |

FOREIGN PATENT DOCUMENTS

| | | |
|---|---|---|
| 2-100743 | 4/1990 | Japan . |
| 7-271634 | 10/1995 | Japan . |
| 7-311603 | 11/1995 | Japan . |

OTHER PUBLICATIONS

Shah et al.; Programmable Memory Trends in the Automotive Industry; IEEE; Transportation Electronics 1990; pp. 143–154.

Primary Examiner—Michael J. Zanelli
Attorney, Agent, or Firm—Nixon & Vanderhye P.C.

[57] ABSTRACT

A vehicle electronic control unit (ECU) prevents its power supply from being cut off while it is in the process of re-programming data in a re-programmable nonvolatile memory. An ECU includes a microcomputer which, after receiving a re-program request from a re-programming device, determines if an identification code in a flash memory and an identification code from the re-programming device match. If the codes do match, the microcomputer executes re-program processing for overwriting all the data in the flash memory, including a control program. The ECU is supplied with power from a battery by way of a main relay whose contacts are closed when a vehicle ignition switch (IGSW) is turned on or when a drive signal is applied to the relay. When the IGSW starts to operate, the microcomputer outputs the drive signal to the main relay and, when it completes re-program processing and the IGSW is off, the microcomputer stops outputting the drive signal. Thus even if the IGSW is switched off during execution of re-program processing, power to the microcomputer is maintained so that the re-program processing is not interrupted.

16 Claims, 5 Drawing Sheets

VEHICLE CONTROL SYSTEM AND UNIT FOR PREVENTING POWER SUPPLY CUTOFF DURING RE-PROGRAMMING MODE

CROSS-REFERENCE TO RELATED APPLICATION

The present application is related to, and claims priority in, Japanese Patent Application Hei. 10-58563, the contents of which are incorporated herein by reference.

BACKGROUND OF THE INVENTION

1. Field of the Invention

The present invention relates generally to vehicle control systems, and particularly to a vehicle control system control unit with re-programming capability and that prevents power to the controller from being cut off during re-programming.

2. Description of Related Art

A conventional control unit for controlling a control object such as a vehicle engine or transmission includes an associated control program held in a nonvolatile memory, such as flash memory or EEPROM, which can be re-programmed. The control unit is constructed so that the data in the re-programmable nonvolatile memory can be re-programmed even on an after-market basis.

Such a control unit also has a microcomputer operating on power from a vehicle battery. Normally, the microcomputer carries out control processing for controlling devices such as injectors and motors in accordance with a control program stored in the re-programmable nonvolatile memory. However, when it receives a re-program command from a re-programming device, the microcomputer overwrites the data in the re-programmable nonvolatile memory with new data transmitted from the re-programming device.

In a control unit such as the one disclosed in Japanese Unexamined Patent Publication No. Hei.7-311603, a unit identification code may be stored in the re-programmable nonvolatile memory and re-program processing carried out only when that identification code and an identification code transmitted from a re-programming device match, thereby preventing improper alteration of the data in the re-programmable nonvolatile memory.

In a control unit such as the one disclosed in Japanese Unexamined Patent Publication No. Hei.7-271634, a program for performing re-programming processing is stored in the re-programmable nonvolatile memory along with the control program. When program is to be executed, it is transferred to a volatile RAM and executed therefrom.

With a control unit to which the former of the above techniques has been applied, if for some reason it becomes necessary for the identification code of the unit to be changed on an after-market basis, this can be done because it is possible for the identification code of the unit to be re-programmed along with the control program.

Also, with a control unit to which the latter of the above techniques has been applied, if for some reason it becomes necessary to change the specifications of the re-program processing on an after-market basis, this can be done because it is possible for the program as well as the control program to be re-programmed.

However, with a control unit of the kind described above, if the power supply to the unit is cut off while the microcomputer is executing re-programming, the processing is interrupted, and the data in the nonvolatile memory is left in an incomplete state. When this happens, problems such as [1] and [2] below arise.

[1] In a control unit having an identification code in re-programmable nonvolatile memory, if re-programming is interrupted with all or a part of the identification code having been erased, even if power is supplied to the unit again and re-programming is re-attempted, because the identification code from the re-programming device and the identification code of the unit will not match, re-program processing cannot be executed again.

[2] In a control unit having a re-programming program in a re-programmable nonvolatile memory, if re-programming is interrupted with all or a part of the program having been erased, even if power is supplied to the unit again and re-programming is re-attempted, because there is no longer a normal program, re-programming cannot be executed again.

When it becomes impossible to execute re-programming processing again, the control unit can no longer be provided with a normal internal program and consequently becomes unusable.

A control unit of the above type is supplied with battery power only when the ignition switch of the vehicle is on. Therefore, there is a risk of the ignition switch being accidentally switched off by an operator as the data is being re-programmed in the nonvolatile memory, and thus a strong possibility of the re-programming in the control unit consequently being interrupted.

SUMMARY OF THE INVENTION

It is therefore an object of the present invention to provide a vehicle control unit having re-programming capability that prevents the unit power supply from being cut off while data in the re-programmable nonvolatile memory thereof is being re-programmed, thereby preventing interruption of the re-programming process.

According to the present invention, a vehicle control unit has a processor having a re-programmable nonvolatile memory and operating on power from a vehicle battery, and a power supply regulator for supplying power to the processor from the battery when a designated vehicle switch is on.

When the vehicle switch is turned on, the power supply regulator supplies power to the processor. During normal operation, the processor carries out control processing in accordance with a control program stored in the nonvolatile memory. When the processor receives an externally-transmitted re-program command, it carries out re-programming to overwrite data in the nonvolatile memory with newly-provided data.

In particular, the power supply regulator continues supplying power from the battery to the processor even if the switch is turned off, until it receives a cutoff command ordering the power supply to be cut off. The processor is constructed to detect the on/off state of the switch after it completes re-program processing, and output the cutoff command to the power supply regulator if the switch is off.

Therefore, even if the switch is accidentally switched off while the processor is carrying out re-program processing, the power supply regulator continues to supply power from the battery to the processor. Also, because after completing the execution of re-program processing the processor outputs a cutoff command to the power supply regulator ordering the power supply to be cut off, if the switch has been switched off, power continues to be supplied to the processor until the processor finishes executing re-program processing.

Therefore, it is possible to prevent the power supply to the processor from being cut off while the processor is re-programming the nonvolatile memory, thereby preventing the re-programming process from being interrupted.

DETAILED DESCRIPTION OF THE PREFERRED EMBODIMENTS

A preferred embodiment of the invention will now be described with reference to the accompanying drawings.

Figure 1:
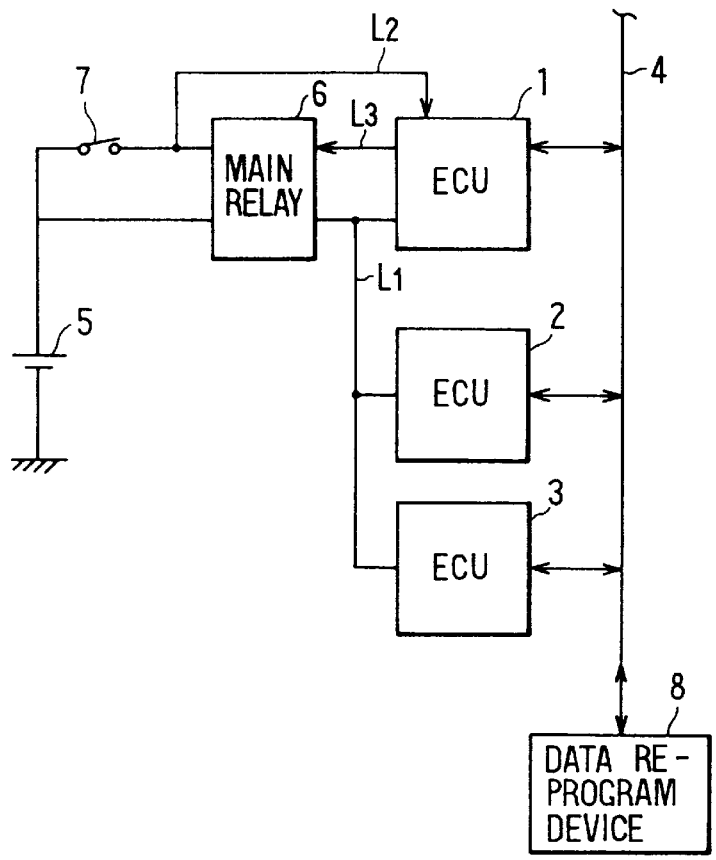
FIG. 1 is a block diagram showing the overall construction of a preferred embodiment of a vehicle control system according to the present invention.

FIG. 1 is a block diagram showing the overall construction of a preferred embodiment of the present invention applied to a vehicle control system.

As shown in FIG. 1, the vehicle control system of the preferred embodiment has three control units (hereinafter, ECUs) 1, 2, 3 for controlling different parts of a vehicle in which the system is installed. For example, the ECU 1 controls an engine, the ECU 2 controls a transmission, and the ECU 3 controls hydraulic circuits of a braking system.

The three ECUs 1, 2, 3 are connected by a communication line 4 disposed inside the vehicle so that the ECUs can communicate with each other.

Also, the ECUs 1, 2, 3 are constructed so that internal control programs thereof can be re-programmed while the ECUs 1, 2, 3 are installed on board the vehicle. When the control program of any of the ECUs 1, 2, 3 is to be re-programmed, a re-programming device 8 is connected to the communication line 4.

In the vehicle control system of this preferred embodiment, the three ECUs 1, 2, 3 are connected to a common power supply line L1 installed in the vehicle. All three of the ECUs 1, 2, 3 are operated with the voltage of a vehicle battery 5 supplied to via a power supply line L1 through a main relay 6 serving as a power supply relay.

When an ignition switch 7 of the vehicle is switched on or a drive signal is fed to the main relay 6, contacts of the main relay 6 close and connect the plus terminal of the battery 5 to the power supply line L1. In this preferred embodiment, the ECU 1 feeds a drive signal to the main relay 6 by way of a signal line L3.

That is, when the ignition switch 7 is switched on, the contacts of the main relay 6 close and a battery voltage from the battery 5 is supplied to each of the ECUs 1, 2, 3 by way of the power supply line L1, whereupon the ECUs 1, 2, 3 start to operate. The ECU 1 then detects the on/off state of the ignition switch 7 on the basis of the voltage level of a signal line L2 for switch state detection. Even when the ECU 1 detects that the ignition switch 7 has been switched off, the ECU 1 outputs a drive signal to the signal line L3 and thereby keeps the contacts of the main relay 6 closed until it determines that a power cutoff condition is established. Therefore, even when the ignition switch 7 is switched off, until the above-mentioned power cutoff condition is established, the contacts of the main relay 6 remain closed. When the ignition switch 7 has been switched off and furthermore the power cutoff condition is established, the power supply to all of the ECUs 1, 2, 3 is cut off.

Next, the internal construction of each of the ECUs 1, 2, 3 will be described, taking the ECU 1 as an example.

Figure 2:
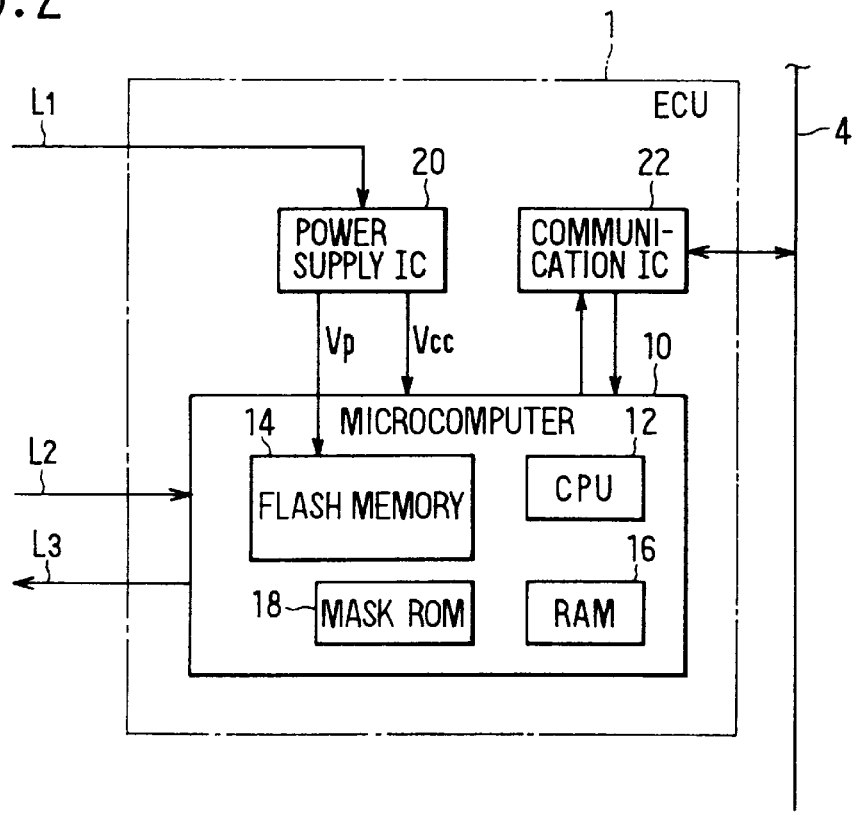
FIG. 2 is a block diagram showing the internal construction of an ECU of FIG. 1.

As shown in FIG. 2, the ECU 1 has a single chip microcomputer 10 as a processor, a communication IC 22 including transmitting and receiving circuits enabling the microcomputer 10 to perform communication with the other ECUs 2, 3 or a re-programming device 8 by way of the communication line 4, and a power supply IC, or power regulator, 20 for receiving the battery voltage from the power supply line L1 and supplying an operating voltage VCC (for example 5V) to parts of the ECU 1 such as the microcomputer 10 and the communication IC 22.

Built into the microcomputer 10 are an ordinary CPU (central processing unit) 12 for executing programs, a nonvolatile flash memory 14 and a mask ROM 18 in which the programs executed by the CPU 12 (more specifically, data constituting those programs) and data referenced in the execution of those programs are stored, a RAM 16 serving as volatile memory for temporarily storing computation results produced by the CPU 12, I/O circuits for inputting and outputting signals, and various registers (not shown).

The flash memory 14 is a nonvolatile ROM whose data can be erased and rewritten when a predetermined re-programming voltage VP (for example 12V) is impressed upon it. A control program for controlling devices such as electromagnetic valves and motors mounted in the vehicle (not shown), an identification code of the ECU in which the respective microcomputer 10 is installed, and a re-programming program for overwriting data held in the flash memory 14 with new data transmitted from a re-programming device 8 are held in the flash memory 14.

The mask ROM 18, on the other hand, is a nonvolatile ROM whose data cannot be re-programmed. A boot program is held in this mask ROM 18 and executed immediately after resetting of the microcomputer 10 is discontinued.

In this preferred embodiment, the power supply IC 20 impresses the re-programming voltage VP on the flash memory 14 in response to a command from the microcomputer 10. The power supply IC 20 also has a so-called power-on resetting function for outputting a reset signal to the microcomputer 10 for a predetermined time, from when the operating voltage VCC starts to be supplied as the ignition switch 7 is switched on, and within which the operating voltage VCC can be expected to stabilize.

The other ECUs 2, 3 have the same construction as the ECU 1 except that the associated microcomputers 10 are not connected to the signal lines L2, L3 for controlling the main relay 6. That is, of the three ECUs 1, 2, 3, only the microcomputer 10 of the ECU 1 is connected to the signal lines L2, L3 as shown in FIG. 2.

In each of the ECUs 1, 2, 3 constructed as described above, when the ignition switch 7 is switched on, power is supplied from the battery 5 to the microcomputer 10 by way of the main relay 6, the power supply line L1 and the power supply IC 20.

Then, when the reset signal to the microcomputer 10 from the power supply IC 20 is discontinued, the microcomputer 10 first executes the boot program stored in the mask ROM 18. Subsequently, during normal operation, i.e., when there is no re-program request message from a re-programming device 8, the microcomputer calls the control program stored in the flash memory 14 following the boot program.

Thereafter, when the CPU 12 of the microcomputer 10 executes the control program in the flash memory 14 in each of the ECUs, each of the ECUs 1, 2, 3 carries out control processing to control devices of respectively allocated control objects, while performing data communication with others of the ECUs by way of the communication line 4.

The ECU 1 has a program for controlling the main relay 6 added to the control program held in its flash memory 14. As mentioned above, the microcomputer 10 of the ECU 1 detects the on/off state of the ignition switch 7 on the basis of the voltage level of the signal line L2, and outputs a drive signal to the main relay 6 through the signal line L3 until it determines that the ignition switch 7 has been switched off and a power cutoff condition is established.

When, on the other hand, the microcomputer 10 in any of the ECUs 1, 2, 3 detects during execution of its boot program that a re-program request message has been transmitted from a reprogramming device 8, it transfers the program stored in its flash memory 14 to its RAM 16. Subsequently, it determines whether or not its own identification code in its flash memory 14 and an identification code transmitted from the re-programming device 8 match. When the two identification codes match, the ECU carries out re-program processing for overwriting all data in the flash memory 14 with new data transmitted from the re-programming device 8.

Next, details of the main processing executed by the microcomputer 10 of each of the ECUs 1, 2, 3 will be described with reference to FIGS. 3–7.

Figure 3:
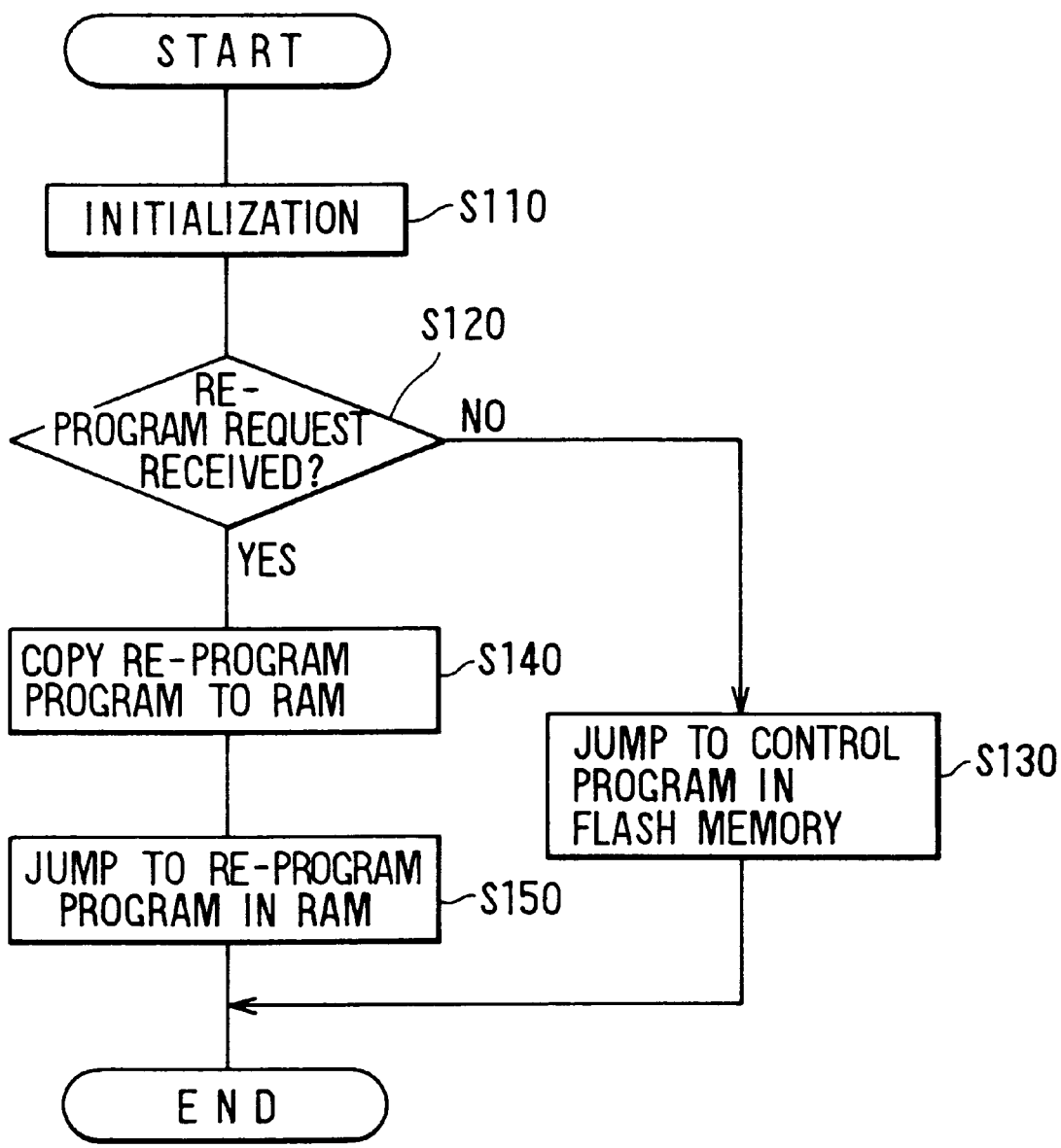
FIG. 3 is a flow diagram showing processing executed from immediately after the start of operation in each of the ECUs of FIG. 1.

As shown in FIG. 3, in each of the ECUs 1, 2, 3, when the microcomputer 10 starts operating from a reset state as the ignition switch 7 is switched on, it starts to execute the boot program held in the mask ROM 18. At S110, the RAM 16 and various registers are initialized. Also, the microcomputer 10 of the ECU 1 starts to continuously output a drive signal to the main relay 6 through the signal line L3 as a result of the initialization processing at S110.

At S120, in the microcomputers 10 of all the ECUs 1, 2, 3, it is determined whether or not a re-program request message has been received from a re-programming device 8 within a predetermined time from the start of operation of the microcomputer 10. When it is determined that a re-program request message has not been received, processing proceeds to S130 and jumps to the control program stored in the flash memory 14. Thereafter, the control program in the flash memory 14 is executed and the normal control processing described above is carried out.

When, on the other hand, it is determined at S120 that a re-program request message has been received from a re-programming device 8, processing moves to S140 and copies the program stored in the flash memory 14 to the RAM 16. Then, at S150, processing jumps to the program thus copied to the RAM 16.

Figure 4:
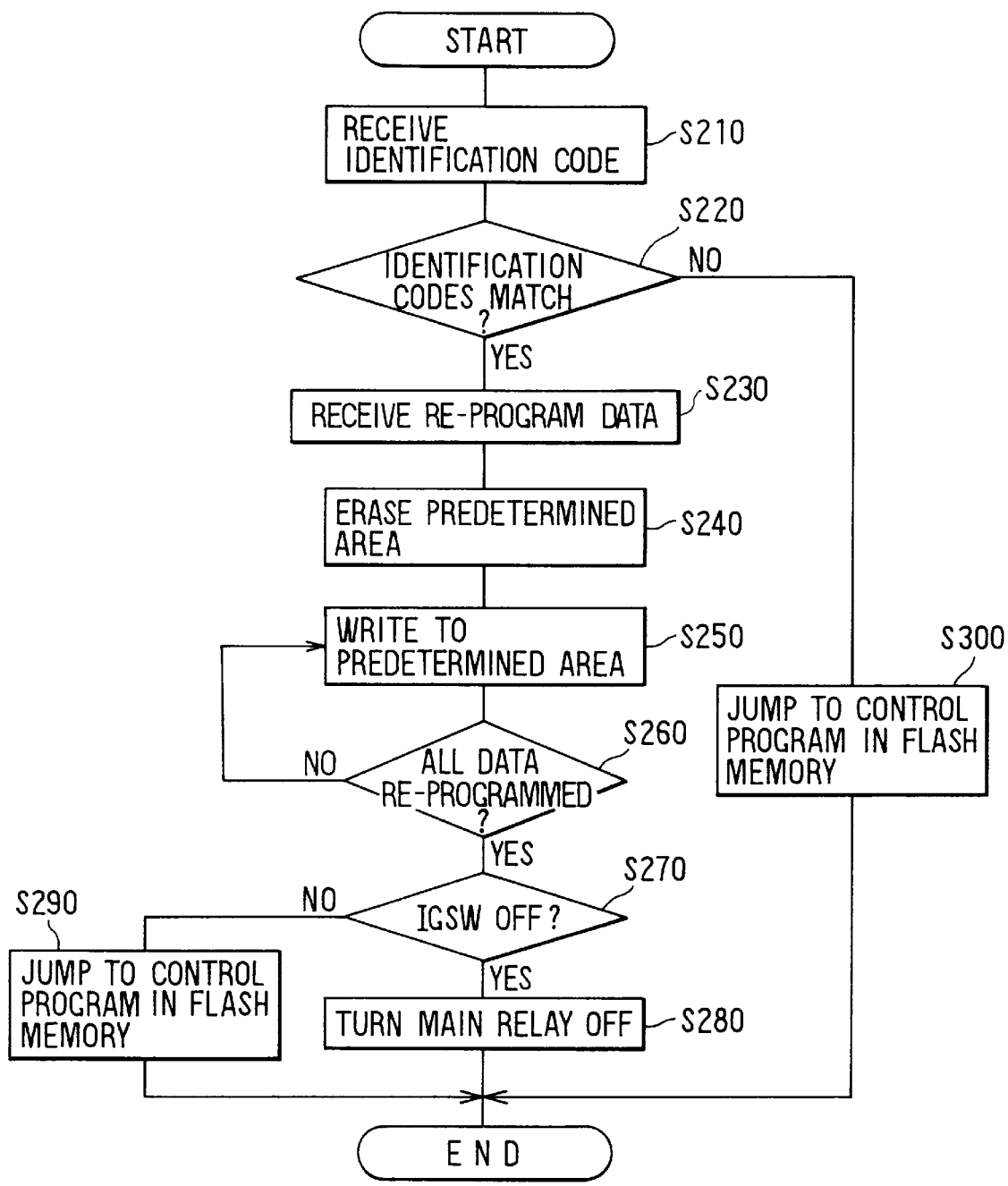
FIG. 4 is a flow diagram showing a re-programming process executed in a designated ECU (ECU 1) of FIG. 1.
Figure 7:
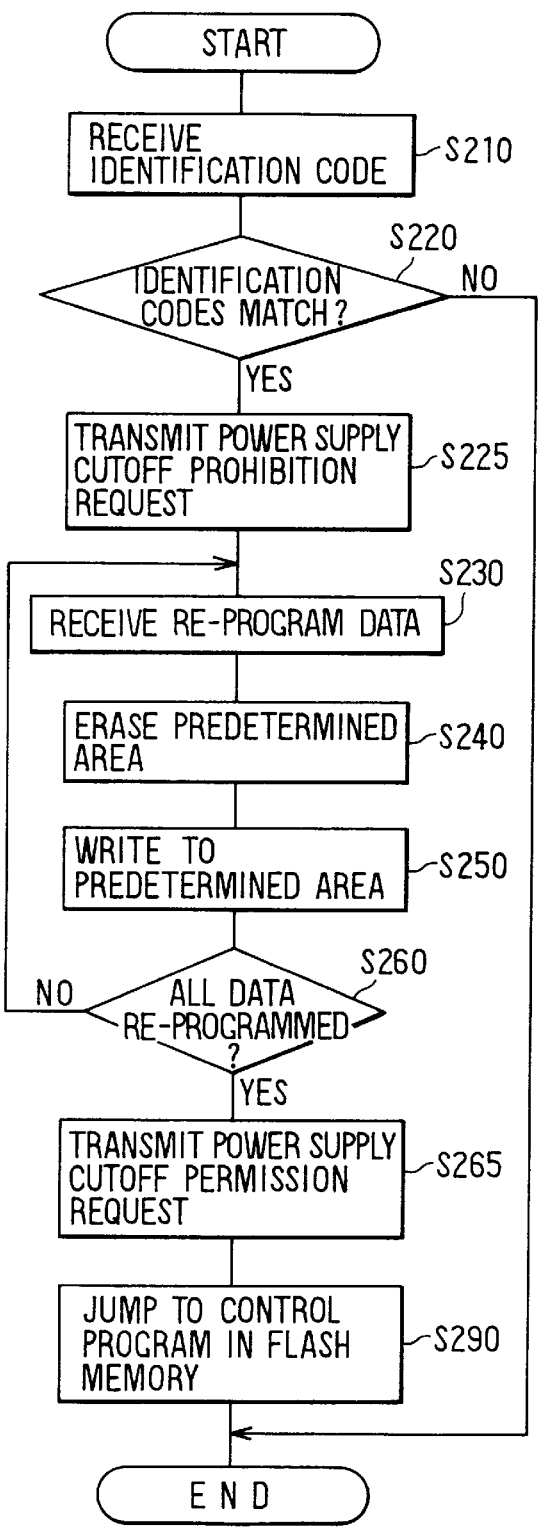
FIG. 7 is a flow diagram showing a re-programming program executed by ECUs (ECUs 2, 3) other than the designated ECU (ECU 1) of FIG. 1.

Thereafter, in the ECU 1, the microcomputer 10 executes the processing of the program shown in FIG. 4, and in each of the other ECUs 2, 3 the microcomputer 10 executes the processing of the program shown in FIG. 7. That is, a program for executing the processing of FIG. 4 is stored as a program in the flash memory 14 of the microcomputer 10 in the ECU 1, and a program for executing the processing of FIG. 7 is stored as a program in the flash memory 14 of the microcomputer 10 of each of the ECUs 2, 3.

The processing of the program that the microcomputer 10 of the ECU 1 copies from its flash memory 14 to its RAM 16 and jumps to at S140 and S150 of FIG. 3 will now be described.

As shown in FIG. 4, when the microcomputer 10 of the ECU 1 starts to execute this program, first, at step S210, it receives an identification code transmitted from the re-programming device 8 after the above-mentioned re-program request message. Then, at S220 it determines whether or not this received identification code and the identification code stored in its own flash memory 14 are the same.

When it determines that the two identification codes match, the microcomputer 10 infers that a re-program request message has been transmitted to its own ECU from the re-programming device 8. Accordingly, it carries out the re-program processing of S230–S260.

That is, first, at S230, the microcomputer 10 receives a predetermined number of bytes of re-program data (i.e. a predetermined number of bytes of new data to be stored in the flash memory 14) transmitted from the re-programming device 8. Then, at S240, it impresses the re-programming voltage VP on the flash memory 14 from the power supply IC 20 and erases the data of an area of memory in the flash memory 14 where the re-program data received at S230 is to be written. Subsequently, at S250, it writes the re-program data received at S230 to the memory area in the flash memory 14 where it erased the data at S240. Processing then proceeds to S260 and determines whether or not re-programming of all of the data in the flash memory 14 is finished. If re-programming of all of the data is not finished, then processing returns to S250.

When, on the other hand, at S260 it is determined that re-programming of all the data of the flash memory 14 is finished, processing proceeds to S270. At S270, the microcomputer 10 detects the on/off state of the ignition switch 7. If the ignition switch 7 is off, the microcomputer stops outputting the drive signal to the main relay 6 at S280 and ends the present re-program processing. As a result, the main relay 6 is turned off, the power supply from the battery 5 to all of the ECUs 1, 2, 3 is cut, and the operation of all the ECUs 1, 2, 3 stops.

When, on the other hand, at S270 it is determined that the ignition switch 7 is on, processing moves to S290 and jumps to the control program stored in the flash memory 14. Thereafter, as at S130 of the boot program (FIG. 3), the control program in the flash memory 14 is executed, and normal control processing is carried out. However, in this case, it is control processing based on the new control program re-programmed during the re-program processing of S230–S260 that is carried out. At this time, the identification code and the program in the flash memory 14 have been overwritten with the same ones as before or with new ones.

When, on the other hand, at S220 it is determined that the identification codes do not match, the microcomputer 10 infers that the re-program request message from the re-programming device 8 is intended for another ECU and shifts to S300 without performing the re-program processing of S230–S260.

At S300, processing jumps to the control program held in the flash memory 14. Thereafter, as at S130 of the boot program (FIG. 3), the existing control program in the flash memory 14 is executed and normal control processing is thereby carried out.

Figure 5:
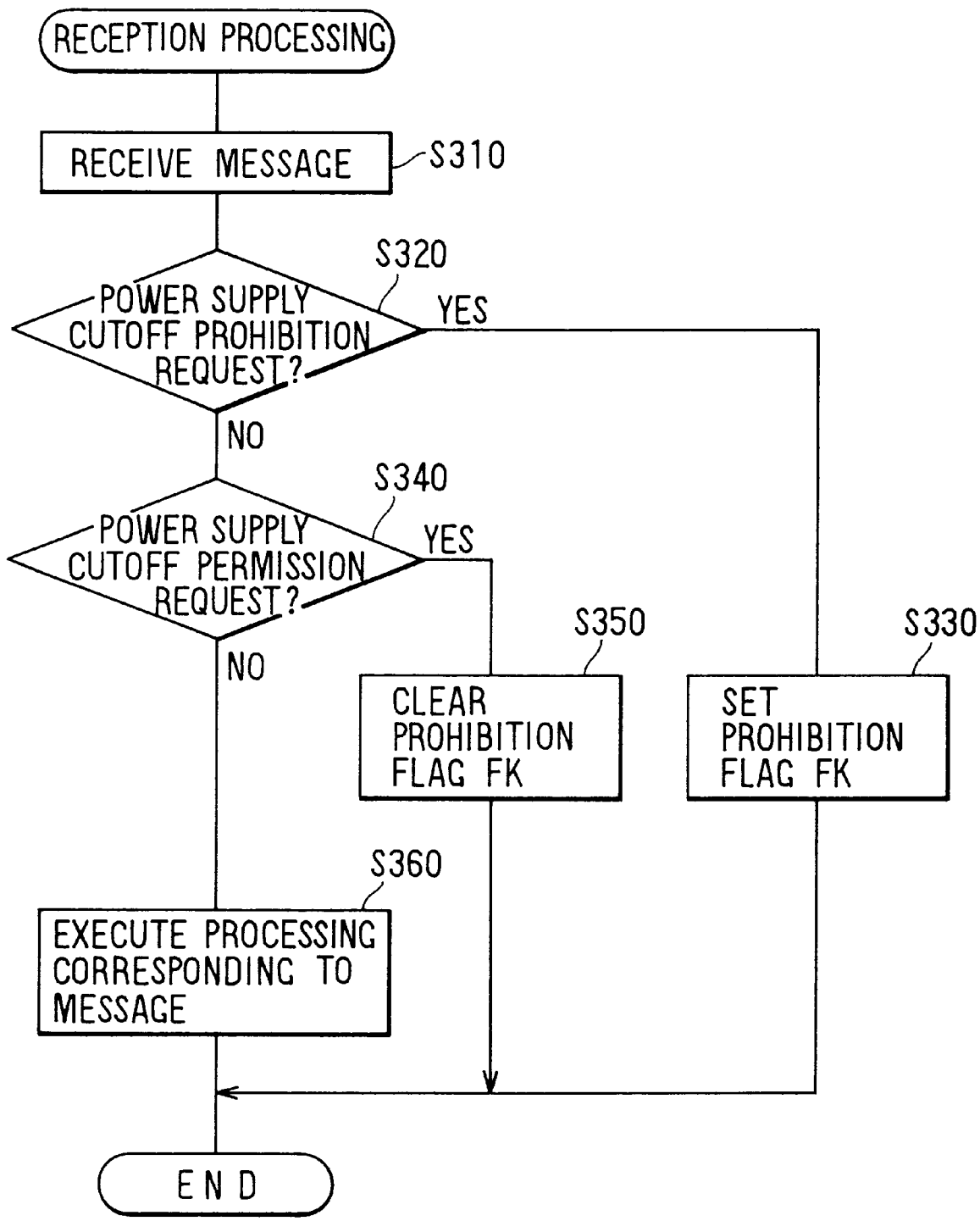
FIG. 5 is a flow diagram showing reception processing executed by the designated ECU (ECU 1) of FIG. 1.
Figure 6:
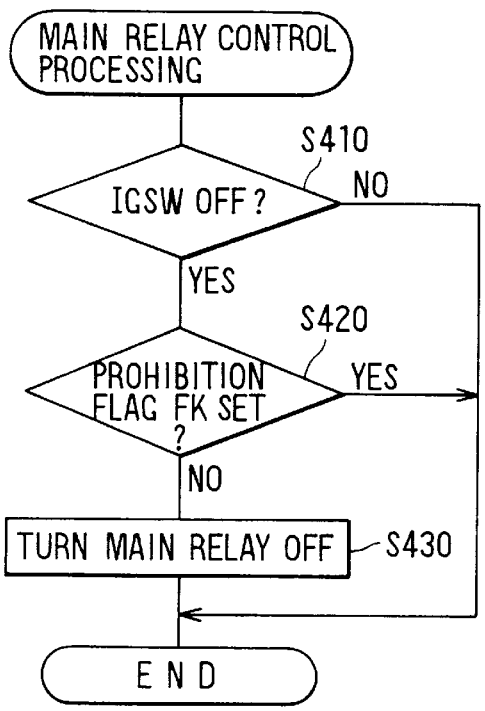
FIG. 6 is a flow diagram showing main relay control processing executed by the designated ECU (ECU 1) of FIG. 1.

Included in the control program stored in the flash memory 14 of the ECU 1 are a reception processing program shown in FIG. 5 for carrying out operations corresponding to different messages transmitted from the other ECUs 2, 3, and a main relay control processing program shown in FIG. 6 for controlling the main relay 6.

Therefore, when at either S130 of FIG. 3, S290 of FIG. 4 or S300 of FIG. 4, processing jumps to the control program in the flash memory 14, the microcomputer 10 of the ECU 1 executes at least the reception processing of FIG. 5 and the main relay control processing of FIG. 6.

Specifically, first, the reception processing shown in FIG. 5 is executed every time a message is received from one of the other ECUs 2, 3 via the communication line 4.

When the microcomputer 10 of the ECU 1 starts to execute the reception processing, at step S310 it receives a message transmitted to it.

Then, at S320, it determines whether or not the message received at S310 is a power supply cutoff prohibition request from one of the other ECUs 2, 3. If it is a power supply cutoff prohibition request, at S330, the microcomputer sets a prohibition flag Fk showing that to switch the main relay 6 off is prohibited (specifically, the prohibition flag Fk is set to '1') and then ends the present reception processing. A power supply cutoff prohibition request is a message transmitted to the ECU 1 by the microcomputer 10 of one of the other ECUs 2, 3 to prohibit power supply cut-off to its own ECU, and corresponds to the 'prohibition signal' referred to elsewhere in the present invention.

When at S320 it is determined that the message received in S310 is not a power supply cutoff prohibition request, processing shifts to S340. At this time, it is determined whether or not the message received at S310 is a power supply cutoff permission request from one of the other ECUs 2, 3. If it is a power supply cutoff permission request, at the following S350, the prohibition flag Fk is cleared (specifically, the prohibition flag Fk is set to '0') and the present reception processing is ended. A power supply cutoff permission request is a message transmitted to the ECU 1 by the microcomputer 10 of one of the other ECUs 2, 3 to permit cutting off of the power supply to its own ECU and corresponds to the 'permission signal' referred to elsewhere in the present invention.

When at S340 it determines that the message received at S310 is not a power supply cutoff permission request, processing shifts to S360 and the microcomputer 10 of the ECU 1 executes processing corresponding to the received message and ends the reception processing. Processing corresponding to the received message is processing for carrying out an exchange of data such as, if for example the received message is a message requesting control data indicating the present engine speed, replying with control data indicating the most recent engine speed obtained by the ECU 1.

The main relay control processing shown in FIG. 6, on the other hand, is executed at predetermined time intervals. When the microcomputer 10 of the ECU 1 starts to execute the main relay control processing, first, at step S410, it detects the on/off state of the ignition switch (IGSW) 7. If the ignition switch 7 is on, the microcomputer ends the present processing directly, but if the ignition switch 7 is off, it proceeds to S420 and determines whether or not the above-mentioned prohibition flag Fk has been set.

Here, if the prohibition flag Fk has been set, it is determined that the above-mentioned power cutoff condition is not established, and the present processing is ended.

If, on the other hand, the prohibition flag Fk has not been set, processing determines that the above-mentioned power cutoff condition is established and proceeds to S430. At S430, the outputting of the drive signal to the main relay 6 is stopped and the present processing is ended. When this happens, the main relay 6 turns off, and the operation of all the ECUs 1, 2, 3 is stopped.

Next, referring to FIG. 7, the processing of the program that the microcomputer 10 of either of the other ECUs 2, 3 copies from its flash memory 14 to its RAM 16 and jumps to S140 and S150 of FIG. 3 will be described. In FIG. 7, the same processing content as in FIG. 4 has been assigned step numbers as in FIG. 4, and only steps that are different from FIG. 4 will be discussed.

As shown in FIG. 7, the processing of the program executed by the microcomputers 10 of the ECUs 2, 3 differs from the processing of the program executed by the microcomputer 10 of the ECU 1 in the following points (1) through (3).

(1) First, when at step S220 the microcomputer 10 determines that the identification code received at S210 and the identification code stored in its own flash memory 14 do not match, it ends processing of the present program for re-programming. That ECU then assumes a substantially non-operating state.

(2) When, on the other hand, at S220 the microcomputer 10 determines that the identification code received at S210 and the identification code stored in its own flash memory 14 do match, at S225 it transmits the above-mentioned power supply cutoff prohibition request to the ECU 1 and then performs the re-program processing of S230–S260.

(3) Thereafter, when at S260 the microcomputer 10 determines that re-programming of the flash memory 14 is finished (that is, when the execution of re-program processing finishes), at S265 it transmits the above-mentioned power supply cutoff permission request to the ECU 1. Processing then proceeds to S290 and jumps to the control program stored in the flash memory 14. Thereafter, a new control program re-programmed in the re-program processing of S230–S260 is executed and normal control processing is thereby carried out.

In a vehicle control system according to the present preferred embodiment as described above, if the ignition switch 7 is switched on in the normal state, that is, without the re-programming device 8 being connected to the communication line 4, at S130 of FIG. 3 the microcomputers 10 of the ECUs 1, 2, 3 start to execute control programs consisting of data in their respective flash memories 14. Thereafter, the microcomputers perform control processing for controlling different parts of the vehicle until the ignition switch 7 is switched off.

When, on the other hand, the data stored in the flash memory 14 of the ECU 1 is to be re-programmed, a re-programming device 8 is connected to the communication line 4 before the ignition switch 7 is switched on, and a re-program request message and the identification code of the ECU 1 are successively transmitted from the re-programming device 8 to the communication line 4.

When this is done, at S140 and S150 of FIG. 3 the microcomputer 10 of the ECU 1 copies the program in its flash memory 14 (FIG. 4) to its RAM 16 and executes the program for re-programming. The microcomputer 10 then makes an affirmative determination at S220 of FIG. 4 (S220: YES), and by carrying out the re-program processing of S230–S260 overwrites all the data in its flash memory 14 with new data received from the re-programming device 8.

In this case, at S140 and S150 of FIG. 3 the microcomputers 10 of the other ECUs 2, 3 also copy the program (FIG. 7) in their flash memories 14 to their RAMs 16 and execute that program. However, the microcomputers 10 of the ECUs 2, 3 make a negative determination at S220 of FIG. 7 (S220: NO) and assume a non-processing state wherein they perform no substantial processing.

Here, in particular, in the initialization processing of S110 of FIG. 3, the microcomputer 10 of the ECU 1 outputs a drive signal to the main relay 6 immediately after it starts operating so that, even if the ignition switch 7 is switched off, the main relay 6 remains on.

When the microcomputer 10 of the ECU 1 finishes executing the program (S260: YES), it detects the on/off state of the ignition switch 7 (S270). If the ignition switch 7 is off (S270: YES), the microcomputer stops outputting the drive signal to the main relay 6 and thereby turns the main relay 6 off (S280).

Thus, with the ECU 1 of this preferred embodiment, even if the ignition switch 7 is accidentally switched off while the microcomputer 10 of the ECU 1 is carrying out re-program processing, power from the battery 5 continues to be supplied to that microcomputer 10 by way of the main relay 6, the power supply line L1 and the power supply IC 20. Also, because the main relay 6 is turned off after the microcomputer 10 finishes executing re-program processing, the supply of power provided by the main relay 6 continues without fail until the microcomputer 10 of the ECU 1 finishes executing re-program processing.

Therefore, with this preferred embodiment it is possible to prevent the power supply to the microcomputer 10 of the ECU 1 from being cut of f while the microcomputer is re-programming the flash memory 14, thereby preventing interruption of the data re-programming.

In particular, because not only the control program but also the program and the identification code of that ECU 1 are stored in the flash memory 14 as object data of re-programming, if the power supply were to be cut off while the microcomputer 10 was carrying out re-program processing, for the aforementioned reasons [1] and [2], it would become impossible for re-program processing to be executed again, and the ECU 1 would become unusable. However, due to the processing of this preferred embodiment, this kind of problem is surely prevented.

When, on the other hand, in the vehicle control system of this preferred embodiment the data stored in the flash memory 14 of an ECU other than the ECU 1, for example the ECU 2, is to be re-programmed, the re-programming device 8 is connected to the communication line 4 before the ignition switch 7 is switched on, and a re-program request message and the identification code of the ECU 2 are successively transmitted from the re-programming device 8 to the communication line 4.

When this is done, at S140 and S150 of FIG. 3 the microcomputer 10 of the ECU 2 copies the program (FIG. 7) in its flash memory 14 to its RAM 16 and executes the program for re-programming. The microcomputer 10 of the ECU 2 makes an affirmative determination at S220 of FIG. 7 (S220: YES), and transmits a power supply cutoff prohibition request to the ECU 1 (S255) before performing the re-program processing of S230–S260 and thereby overwrite all the data in its flash memory 14 with new data transmitted from the re-programming device 8. Also, when it has finished executing re-program processing (S260: YES), the microcomputer 10 of the ECU 2 transmits a power supply cutoff permission request to the ECU 1 (S265) and then executes the new control program in its flash memory 14 (S290).

In this case the microcomputer 10 of the ECU 1 at S140 and S150 of FIG. 3 also copies the program (FIG. 4) in its flash memory 14 to its RAM 16 and then executes the program. However, the microcomputer 10 of the ECU 1 makes a negative determination at S220 of FIG. 4 (S220: NO) and through S300 of FIG. 4 executes at least the reception processing program shown in FIG. 5 and the main relay control processing program shown in FIG. 6.

Accordingly, the microcomputer 10 of the ECU 1 receives the power supply cutoff prohibition request transmitted to it by the microcomputer 10 of the ECU 2. Thereafter, the microcomputer 10 of the ECU 1 sets the prohibition flag Fk (S320–S350) and keeps the main relay 6 on, irrespective of the on/off state of the ignition switch 7, until it receives the power supply cutoff permission request transmitted to it from the microcomputer 10 of the ECU 2 (S410–S430).

In this case, the microcomputer 10 of the ECU 3 also, at S140 and S150 of FIG. 3, copies the program (FIG. 7) in its flash memory 14 to its RAM 16 and executes the program. However, the microcomputer 10 of the ECU 3 makes a negative determination at S220 of FIG. 7 (S220: NO) and assumes a non-processing state.

When the data stored in the flash memory 14 of the ECU 3 is to be re-programmed, a re-programming device 8 is connected to the communication line 4 before the ignition switch 7 is switched on, and a re-program request message and the identification code of the ECU 3 are successively transmitted from the re-programming device 8 to the communication line 4. When this is done, the microcomputer 10 of the ECU 3 transmits a power supply cutoff prohibition request to the ECU 1 and carries out re-program processing. When the microcomputer 10 of the ECU 3 finishes the re-program processing, it transmits a power supply cutoff permission request to the ECU 1. The microcomputer 10 of the ECU 2 assumes a non-processing state.

That is, in the vehicle control system of this preferred embodiment, the microcomputers 10 of the ECUs 2, 3, whose power supply from the battery 5 is controlled by the ECU 1, transmit a power supply cutoff prohibition request to the ECU 1 before initiating re-program processing, and transmit a power supply cutoff permission request to the ECU 1 after completing the execution of that re-program processing. When the microcomputer 10 of the ECU 1 receives a power supply cutoff prohibition request from one of the other ECUs, it continues to output a drive signal to the main relay 6 until it receives a power supply cutoff permission request from the other ECU.

Thus, with the vehicle control system of the present preferred embodiment, even if the ignition switch 7 is accidentally switched off while the microcomputer 10 of either of the ECUs 2, 3 is carrying out re-program processing, power from the battery 5 continues to be supplied to that microcomputer 10. After the microcomputer 10 completes the execution of re-program processing, the main relay 6 is turned off. Therefore, it is possible to prevent the power supply to the microcomputer 10 of the ECU 2 or 3 from being cut off while it is in the process of re-programming the data in its flash memory 14, thereby preventing interruption of the data re-programming.

In particular, in the vehicle control system of this preferred embodiment, in either of the ECUs 2, 3 also, because the program and the identification code are stored in the flash memory 14, if the power supply were to be cut off while the microcomputer 10 of that ECU was carrying out re-program processing, for the aforementioned reasons [1] and [2], that ECU would become unusable. However, with this preferred embodiment, this kind of problem is prevented.

Although the invention has been described here with reference to a specific preferred embodiment thereof, it should be appreciated that the invention is not limited to this preferred embodiment and can of course be practiced in various forms.

For example, although in the ECUs 1, 2, 3 of the preferred embodiment described above the program and the identification code are stored in the flash memory 14 and are re-programmable along with the control program, either or both of the program and the identification code may alternatively be stored in the mask ROM 18. In addition, the program may be received from the re-programming device 8 and transferred to the RAM 16 and executed from the RAM 16.

When both the program and the identification code are stored in the mask ROM 18, or when the identification code is stored in the mask ROM 18 and the program is received from the re-programming device 8 and executed from the RAM 16, even if the power supply is cut off during the execution of re-program processing, re-program processing can be again carried out. However, the vehicle control system of this preferred embodiment is highly advantageous as an interruption of re-program processing caused by an unexpected power supply cutoff can be prevented, thereby preventing re-program processing from having to be started over again.

Also, although in the vehicle control system of the preferred embodiment described above all of the ECUs 1, 2, 3 connected to the communication line 4 are constructed to be on-board re-programmable, alternatively only the ECU 1 may be made on-board re-programmable. In this case, of the processing executed by the microcomputer 10 of the ECU 1, S300 of FIG. 4, S320–S350 of FIG. 5 and S420 of FIG. 6 can be dispensed with. Alternatively, only one of the ECUs 2, 3 may be made on-board re-programmable.

Further, although in the preferred embodiment described above the re-programming device 8 is connected to the communication line 4, alternatively each of the ECUs 1, 2, 3 may be provided with a dedicated connector for connecting the re-programming device 8, with the re-programming device 8 then being individually connected to the ECUs 1, 2, 3.

Furthermore, although in the ECUs 1, 2, 3 of the preferred embodiment described above a flash memory 14 was used as the re-programmable nonvolatile memory, other electronically re-programmable memory devices, such as an EEPROM may alternatively be used.

While the above description constitutes the preferred embodiment of the present invention, it should be appreciated that the invention may be modified without departing from the proper scope or fair meaning of the accompanying claims. Various other advantages of the present invention will become apparent to those skilled in the art after having the benefit of studying the foregoing text and drawings taken in conjunction with the following claims.

What is claimed is:

1. A vehicle control unit comprising:

an electronic control unit (ECU) having a re-programmable nonvolatile memory and powered by a vehicle battery, the ECU normally carrying out vehicle control processing in accordance with a control program stored in the nonvolatile memory, and carrying out re-program processing for overwriting data in the nonvolatile memory with re-program data upon receiving a re-program command; and a power supply regulator located between the ECU and the vehicle battery for supplying power to the ECU from the battery when a designated vehicle switch is closed;

the power supply regulator continuing to supply power to the ECU from the battery until the power supply receives a cutoff command, even if the switch is open;

the ECU detecting the state of the switch after finishing the re-program processing, and outputting the cutoff command to the power supply regulator if the switch is open.

2. The vehicle control unit of claim 1, wherein the nonvolatile memory includes a program for performing the re-program processing stored therein with the control program as re-programmable data, the ECU also including a read/writable volatile memory and, upon receiving the re-program command, transfers the program in the nonvolatile memory to the volatile memory for execution thereof.

3. The vehicle control unit of claim 1, wherein the ECU also includes a non-re-programmable non-volatile memory wherein at least one of the program and an identification code is stored.

4. The vehicle control unit of claim 1, wherein the ECU is further for erasing a predetermined area of the nonvolatile memory corresponding to where the re-program data is to be stored.

5. The vehicle control unit of claim 1, wherein the nonvolatile memory includes an identification code of the control unit stored as re-programmable data with the control program therein, the ECU determining whether an externally-provided identification code and the identification code in the nonvolatile memory match when receiving the re-program command, the ECU carrying out the re-program processing only when the stored and externally-provided identification codes match.

6. The vehicle control unit of claim 1, further comprising other ECUs each for controlling at least one specified vehicle object and each for inhibiting power cutoff through the ECU when re-program processing is being carried out at the respective other ECU.

7. A first vehicle control unit powered by a battery controlled by a second control unit, comprising:

an ECU, including a re-programmable nonvolatile memory, for controlling vehicle devices, and for carrying out re-program processing for overwriting data in the nonvolatile memory with new externally-provided data upon receiving a re-program command, wherein the ECU outputs to the second control unit a prohibition signal for prohibiting the power supply to the first control unit from being cut off before executing the re-program processing and after receiving the re-program command, and after completing the execution of the re-program processing, outputting to the second control unit a permission signal for permitting the power supply to the first control unit to be cut off.

8. The first vehicle control unit of claim 7, wherein the nonvolatile memory includes a control program for performing the control processing and a program for performing the re-program processing stored therein as re-programmable data, and the ECU includes a read/writable volatile memory and, upon receiving the re-program command, transfers the program in the nonvolatile memory to the volatile memory and executes the program for re-programming.

9. The first vehicle control unit of claim 7, wherein the nonvolatile memory includes a control program for performing the control processing and a control unit identification code stored therein as re-programmable data, the ECU determining whether or not an externally-provided identification code and the identification code in the nonvolatile memory match when receiving the re-program command, and carrying out the re-program processing only when the identification codes match.

10. The first vehicle control unit of claim 7, wherein the second control unit maintains the power supply to the first control unit after receiving the prohibition signal until it receives the permission signal.

11. A vehicle control system comprising:

a power supply relay for connecting a vehicle battery to a vehicle power supply line based on a received drive signal; and a plurality of control units powered through the supply line by the battery;

a designated control unit among the plurality of control units outputting the drive signal to the power supply relay after a vehicle ignition switch is turned on and until a predetermined power cutoff condition is established; and at least one control unit other than the designated control unit comprising an ECU having a re-programmable nonvolatile memory and operating on power from the battery, the ECU controlling processing in accordance with a control program stored in the nonvolatile memory;

the ECU carrying out re-program processing for overwriting data in the nonvolatile memory with new externally-provided data upon receiving an external re-program command and, prior to executing the re-program processing, outputting a prohibition signal to the designated control unit for prohibiting cutting off of the power to the at least one control unit;

the ECU, after completing the re-program processing, outputting to the designated control unit a permission signal for permitting cutting off of the power to the at least one control unit, the designated control unit continuing to output the drive signal to the power supply relay until the permission signal is received.

12. A method of controlling data re-programming at an electronic control unit (ECU), comprising the steps of:

receiving a data re-program request;

determining if a received identification code matches a stored identification code;

generating a power supply cutoff prohibition request if the received identification code matches the stored identification code;

storing re-program data;

transmitting a power supply cutoff command if system operation has been terminated and after completion of the step of storing; and controlling a system object based on the stored re-program data if the system operation has not been terminated.

13. The method of claim 12, further comprising the step of assuming a substantially non-operating state if the received identification code does not match the stored identification code.

14. The method of claim 12, wherein the step of storing re-program data comprises the steps of:

receiving remotely-transmitted re-program data;

erasing a predetermined memory storage area; and writing the re-program data to the predetermined memory storage area.

15. The method of claim 12, wherein the method is for controlling a vehicle controller, and wherein the steps of transmitting and controlling comprise the steps of:

transmitting a power supply cutoff command if a vehicle ignition switch has been turned off and after completion of the step of storing; and controlling a vehicle object based on the stored re-program data if the vehicle ignition switch has not been turned off.

16. The method of claim 12, further comprising the step of selectively controlling data re-programming at one or more of a plurality of ECUs in a like manner.

* * * * *